(12) United States Patent
Fornara et al.

(10) Patent No.: US 9,177,994 B2
(45) Date of Patent: Nov. 3, 2015

(54) INTEGRATED THERMOELECTRIC GENERATOR

(75) Inventors: Pascal Fornara, Pourrieres (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 412 days.

(21) Appl. No.: 13/549,248

(22) Filed: Jul. 13, 2012

(65) Prior Publication Data
US 2013/0015549 A1 Jan. 17, 2013

(30) Foreign Application Priority Data
Jul. 13, 2011 (FR) ...................................... 11 56417

(51) Int. Cl.
H01L 27/16 (2006.01)
H01L 35/32 (2006.01)

(52) U.S. Cl.
CPC ............... H01L 27/16 (2013.01); H01L 35/32 (2013.01)

(58) Field of Classification Search
USPC .......................................... 257/467, 470, 930
IPC .......................................................... H01L 27/16
See application file for complete search history.

(56) References Cited

U.S. PATENT DOCUMENTS

| | | | | |
|---|---|---|---|---|
| 6,597,051 B2 * | 7/2003 | Lubomirsky et al. | ......... | 257/461 |
| 8,066,430 B2 * | 11/2011 | Kordic et al. | ................. | 374/117 |
| 2005/0139250 A1 * | 6/2005 | DeSteese et al. | ............. | 136/212 |
| 2006/0237730 A1 * | 10/2006 | Abramov | ......................... | 257/81 |
| 2007/0152352 A1 * | 7/2007 | McKinnell et al. | ........... | 257/930 |
| 2009/0056345 A1 | 3/2009 | Edwards et al. | | |
| 2011/0146741 A1 * | 6/2011 | Hida et al. | ..................... | 136/205 |

FOREIGN PATENT DOCUMENTS

DE 10 2009 000 333 A1 7/2010
JP 1 245549 A 9/1989

OTHER PUBLICATIONS

Kao, P. et al., "Fabrication and Characterization of CMOS-MEMS Thermoelectric Micro Generators,"Sensors, 10, 1315-1325; doi 10.3390/s 100201315; www.mdpi.com/journal/sensors, Feb. 9, 2010, 11 pp.
Huesgen, T. et al., "Design and Fabrication of MEMS Thermoelectric Generators with High Temperature Efficiency," ScienceDirect, www.sciencedirect.com, Sensors and Actuators A, 145-146, 2008, 423-429, Jun. 28, 2007.
Lhermet, H. et al., "Efficient Power Management Circuit: From Thermal Energy Harvesting to Above-IC Microbattery Energy Storage," IEEE Journal of Solid-State Circuits, vol. 43, No. 1, Jan. 2008, 10 pp.
Koester, D. et al., "Embedded Thermoelectric Coolers for Semiconductor Hot Spot Cooling," IEEE, May 30, 2006-Jun. 2, 2006, 6 pp.

(Continued)

Primary Examiner — Eugene Lee
(74) Attorney, Agent, or Firm — Slater & Matsil, L.L.P.

(57) ABSTRACT

An integrated thermoelectric generator includes a semiconductor. A set of thermocouples are electrically connected in series and thermally connected in parallel. The set of thermocouples include parallel semiconductor regions. Each semiconductor region has one type of conductivity from among two opposite types of conductivity. The semiconductor regions are electrically connected in series so as to form a chain of regions having, alternatingly, one and the other of the two types of conductivity.

28 Claims, 10 Drawing Sheets

(56) References Cited

OTHER PUBLICATIONS

Ohta, H. et al., Critical Thickness for Giant Thermoelectric Seebeck Coefficient of 2DEG Confined in $SrTiO_3/SrTi_{0-8}Nb_{0-2}O_3$ Superlattices, ScienceDirect, Thin Solid Films 516, www.sciencedirect.com, Oct. 13, 2007, 5 pp.

Vullers, R. et al., "Micropower Energy Harvesting," www.elsevier.com/locate/sse, Solid State Electronics, 53, Apr. 25, 2009, 10 pp.

Wang, Z. et al., "Realization of a Wearable Miniaturized Thermoelectric Generator for Human Body Applications," Sensors and Actuators A: Physical, 156, www.elsevier.com/locate/sna, Mar. 2009, 8 pp.

Carmo, J. et al., "A Planar Thermoelectric Power Generator for Integration in Wearable Microsystems," Sensors and Actuators A: Physical, 161, May 26, 2010, 6 pp.

Yang, S. et al., "Development of a Thermoelectric Energy Harvester with Thermal Isolation Cavity by Standard CMOS Process," Jun. 17, 2009, 7 pp.

Yang, S. et al., "Design and Verification of a Thermoelectric Energy Harvester with Stacked Polysilicon Thermocouples by CMOS Process," Sensors and Actuators A: Physical, 157, Dec. 2009, 9 pp.

French Search Report received in French Application No. 1156417, mailed Jun. 5, 2012, 6 pages.

* cited by examiner

INTEGRATED THERMOELECTRIC GENERATOR

CROSS-REFERENCE TO RELATED APPLICATIONS

This application claims the priority benefit of French patent application number 1156417, filed on Jul. 13, 2011, which is hereby incorporated by reference to the maximum extent allowable by law.

TECHNICAL FIELD

The invention relates to thermoelectric generators and, in particular embodiments, to thermoelectric generators produced in CMOS technology within an integrated circuit, e.g., thermoelectric generators totally compatible with technologies for the manufacture of so-called "Embedded Non-Volatile Memory."

BACKGROUND

Thermoelectric generators conventionally comprise a support and a set of thermocouples electrically connected in series and thermally connected in parallel. Thermocouples thermally connected in parallel are understood as being thermocouples intended to all be subjected to the same temperature gradient, for example, when a heat source is disposed at one of the ends of the thermocouples and when a cold source is disposed at the other end.

A potential difference which is due to the Seebeck effect is then created between the two terminals of the set of thermocouples electrically connected in series.

Thermoelectric generators have been the subject of numerous publications. Examples of these publications include:
Vullers et al., "Micropower energy harvesting", Solid-State Electronics 53 (2009) 684-693,
Yang et al., "Design and verification of a thermoelectric energy harvester with stacked polysilicon thermocouples by CMOS process", Sensors and actuators A157 (2010) 258-266,
Pin-Hsu Kao et al., "Fabrication and Characterization of CMOS-MEMS Thermoelectric Micro Generators", Sensors 2010, 10, 1315-1325,
Joao Paulo Carmo et al., "A planar thermoelectric power generator for integration in wearable microsystems", Sensors and Actuators A161 (2010), 199-204,
S. M. Yang et al., "Development of a thermoelectric energy harvester with thermal isolation cavity by standard CMOS process", Sensors and Actuators A153 (2009), 244-250,
Ziyang Wang et al., "Realization of a wearable miniaturized thermoelectric generator for human body applications", Sensors and Actuators A156 (2009), 95-102,
Hélène Lhermet et al., "Efficient Power Management Circuit: From Thermal Energy Harvesting to Above-IC Microbattery Energy Storage", IEEE Journal of Solid-State Circuits, vol. 43, n° 1, January 2008,
Till Huesgen et al., "Design and fabrication of MEMS thermoelectric generators with high temperature efficiency", Sensors and Actuators A145-146 (2008), 423-429,
David Koester et al., "Embedded thermoelectric coolers for semiconductor hot spot cooling", 2006 IEEE,
Hiromichi Ohta et al., "Critical thickness for giant thermoelectric Seebeck coefficient of 2DEG confined in $SrTiO_3/SrTi_{0.8}Nb_{0.2}O_3$ superlattices", Thin Solid Films 516 (2008), 5916-5920.

All of these articles describe either the general principles of thermoelectric generators based on the Seebeck effect, using ceramic supports for example, or they describe generators using materials that are not compatible with CMOS technologies, such as piezoelectric materials, or generators based on technological methods of the MEMS (Micro Electro Mechanical System) type having cavities in the substrate under the thermocouples.

SUMMARY OF THE INVENTION

According to one embodiment, a thermoelectric generator is compatible with the manufacturing methods and technologies already widely used in the microelectronics field, in particular for the manufacture of embedded non-volatile memories, well known as "Embedded Memory" by those skilled in the art. Embedded memories are memories that are produced on the same integrated circuit as that containing another component, for example a processor, unlike external memory modules that are produced on a specific integrated circuit different from the one containing a processor.

According to one embodiment, it is proposed to use layers of material, for example, made of polysilicon, which is already available for producing the memory cells, and without the generator requiring the addition of supplementary masks or supplementary process steps in comparison with the existing memory cell manufacturing methods.

In a variant, a generator is proposed whose manufacturing method, whilst being included in a conventional method of manufacturing memory cells, nevertheless requires the addition of some supplementary process steps, which are particularly simple to implement.

According to one aspect, there is proposed an integrated thermoelectric generator, comprising a support and at least one set of thermocouples electrically connected in series and thermally connected in parallel.

According to a general feature of this aspect, the support comprises a semiconductor substrate (for example, made of silicon) and isolating regions (for example shallow trenches known to those skilled in the art as STI for Shallow Trench Isolation). The at least one set of thermocouples comprises parallel semiconductor regions, for example regions of N-doped or P-doped polysilicon, each one having one type of conductivity from among two opposite types of conductivity. At least some of these parallel semiconductor regions are able to extend in the substrate between parallel isolating regions. Alternatively, at least some of these parallel semiconductor regions being able to straddle over a part of the substrate whilst being electrically isolated from the part of substrate, and over at least a part of the isolating regions. Alternatively, at least some of these parallel semiconductor regions are coated with an isolating material and can extend totally over parallel isolating regions, or totally over the regions of substrate situated between the parallel isolating regions.

Whatever the configuration may be, the semiconductor regions are electrically connected in series so as to form a chain of regions having, alternatingly, one and the other of the two types of conductivity.

According to one embodiment, the generator also comprises electrically conductive connections providing the electrical link between the semiconductor regions. These connections are situated above the substrate and connect an end zone of a semiconductor region having one of the two types of conductivity, for example, N-type conductivity, to an end zone of a semiconductor region having the other type of conductivity, for example P-type conductivity.

For example, the connections are coated with an isolating material and comprise metal tracks parallel with the semiconductor regions and connected to the end zones by vertical electrical links, known to those skilled in the art as "vias" or "contacts."

Several structures are possible for producing the set of thermocouples.

It is also possible for the generator to comprise at least one other set of thermocouples electrically connected in series and thermally connected in parallel, all of the sets being mutually electrically and thermally connected in parallel.

According to another aspect, an integrated circuit comprises a semiconductor substrate and, above the substrate, layers of metallization. According to a general feature of this other aspect, the integrated circuit comprises a thermoelectric generator such as defined above, whose substrate is a part of the substrate of the integrated circuit and some of whose electrical connections between the thermocouples comprise metal tracks extending over at least one level of metallization. The integrated circuit comprises structure capable of generating a temperature gradient between the first similar end zones and the second similar end zones of all the parallel semiconductor regions of the thermocouples, and an electrically conductive output structure coupled to the generator in order to deliver the electrical energy produced by the generator.

It is also possible for the integrated circuit to comprise an electrical energy storage unit, electrically coupled to the electrically conductive output structure.

BRIEF DESCRIPTION OF THE DRAWINGS

Other advantages and features of the invention will become apparent on examination of the detailed description of embodiments, which are in no way limiting, and of the appended drawings in which.

DETAILED DESCRIPTION OF ILLUSTRATIVE EMBODIMENTS

Figure 1:
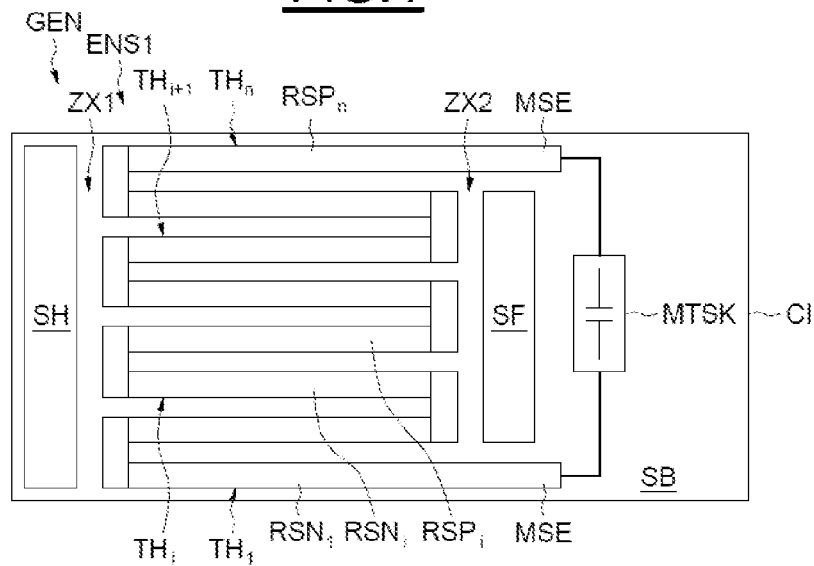
FIG. 1 is a diagrammatic illustration of an embodiment of an integrated circuit according to the invention incorporating an example of a generator according to the invention.

In FIG. 1, the reference CI denotes an integrated circuit comprising a semiconductor substrate SB, for example made of silicon. A thermoelectric generator GEN is disposed within or upon the substrate SB. The thermoelectric generator GEN comprises a set ENS1 of thermocouples $TH_i$.

Each thermocouple $TH_i$ here comprises a semiconductor region in the shape of a bar of N-type conductivity, referenced $RSN_i$, and a semiconductor region of P-type conductivity, referenced $RSP_i$, also in the shape of a bar.

The two semiconductor regions of the thermocouple $TH_i$ are parallel and electrically connected at one of their ends, and the set of thermocouples $TH_i$ are electrically connected in series so as to form a chain of parallel bars alternately having N-type and P-type conductivity.

Electrically conductive output structure MSE is connected to the respective and similar ends of the bars $RSN_1$ and $RSP_n$, belonging to the first thermocouple $TH_1$ and to the last thermocouple $TH_n$, respectively. The electrically conductive output structure MSE can be, for example, metal tracks or an extension of the corresponding bars.

The integrated circuit also comprises a structure capable of generating a temperature gradient between the first similar end zones ZX1 of all the parallel semiconductor regions of the thermocouples and the second similar end zones ZX2 of these parallel semiconductor zones.

By way of indication, the structure can comprise a hot source SH and a cold source SF disposed facing the end zones ZX1 and the end zones ZX2, respectively.

By way of example, the hot source SH can be a part of an integrated circuit generating heat whilst operating whereas the cold source can be another part of the integrated circuit generating less heat, or an absence of a component likely to generate heat.

Because of the Seebeck effect, the pairs PN subjected to this temperature difference or gradient will generate an electric current which will be delivered by the output structure MSE in order, for example, to be stored in electrical energy storage structure MSTK, comprising for example a capacitor connected to the terminals of the output structure MSE in order to form a closed electric circuit.

In a variant, the output structure MSE can be connected to another part of the integrated circuit in order also to form a closed circuit and to be able to supply this other part of the integrated circuit directly with electrical energy.

The output power of the generator GEN depends principally on the number of pairs PN, on the area of the generator, on the value of the temperature gradient and on the type of materials, that is to say, on their Seebeck coefficient.

The thermocouples of the set ENS1 are thermally connected in parallel, that is to say, they are connected so as to be all subjected together to the same temperature gradient.

Figure 2:
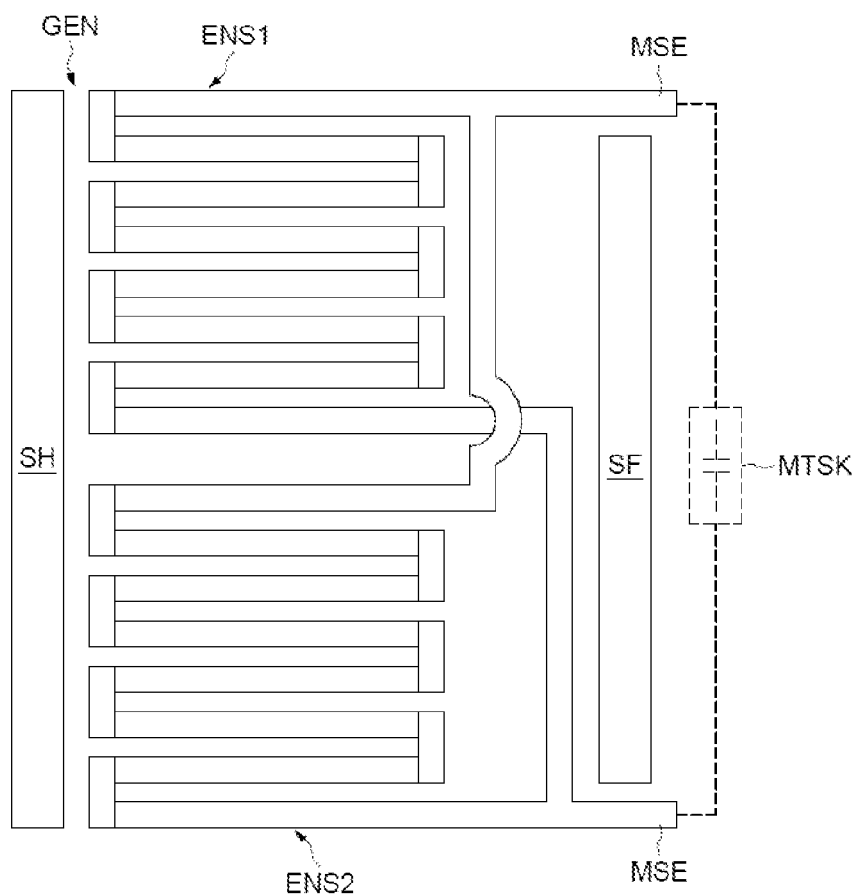
FIG. 2 is a diagrammatic illustration of another example of a generator according to the invention.

In a variant, it is possible, as shown in FIG. 2, for the generator to comprise at least one other set of thermocouples, in this case a second set of thermocouples ENS2, having a structure which is identical to or different from that of the first set ENS1. Here again, the thermocouples of the other set ENS2 are electrically connected in series and thermally connected in parallel.

Moreover, the two sets ENS1, ENS2 are mutually electrically connected in parallel. They are moreover also thermally connected in parallel. That is to say, in the present case, the hot source SH and the cold source SF make it possible to apply the temperature difference created by the hot and cold sources SH and SF to all of the thermocouples of all of the sets.

This makes it possible to provide a higher electrical power at the level of the electrically conductive output means MSE.

Several examples of generators GEN structures will now be described with reference to FIGS. 3 to 15.

Figure 3:
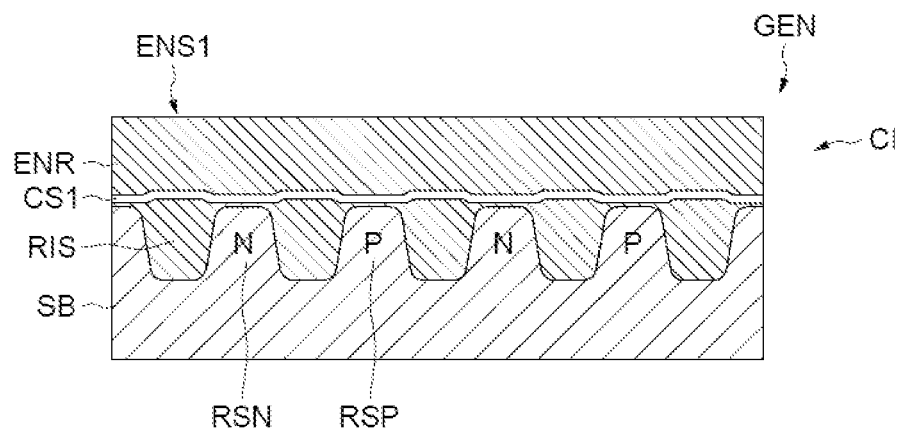
FIGS. 3 to 15 show, in greater detail but still diagrammatically, different embodiments of integrated electric generators according to the invention.

In FIG. 3, the support of the generator GEN comprises a semiconductor substrate SB, for example made of silicon. Parallel isolating regions RIS are formed within the substrate SB. The parallel isolating regions RIS can be, for example, regions of the STI (Shallow Trench Isolation) type.

The set of thermocouples ENS1 is situated in the substrate SB and comprises parallel semiconductor regions RSN, RSP extending in the substrate. Two adjacent semiconductor regions RSN, RSP respectively have one and the other of the two types of conductivity. In this case, the two types are N-type conductivity and P-type conductivity. The parallel semiconductor regions RSN, RSP are separated by an isolating region RIS.

The whole is covered by an isolating layer CS1, for example a layer of silicon nitride. In this example, the isolating layer is itself covered by an isolating coating, for example, silicon dioxide SiO$_2$.

The production of such a generator is perfectly compatible with the conventional method of manufacturing embedded memories and does not necessitate any modification of the method or any additional mask level.

The insulating coating ENR is, for example, the layer in which the metallization levels of the printed circuit are produced.

In this respect, and in general, whatever the structure of the thermocouple set may be, the generator comprises electrically conductive connection structures providing the electrical connection between the semiconductor regions of the thermocouples. These connections are situated above the substrate and connect an end zone of a semiconductor region having one of the two types of conductivity, for example N-type conductivity, to an end zone of a semiconductor region having the other type of conductivity, for example P-type conductivity.

For example, these connections are coated with an isolating material ENR and comprise metal tracks parallel with the semiconductor regions and connected to the end zones by vertical electrical links, for example, contacts or vias.

Furthermore, in order to be perfectly compatible with conventional methods of manufacturing components, for example embedded memories, the metal tracks of the connection means are situated on at least one of the metallization levels of the integrated circuit CI.

Figure 4:
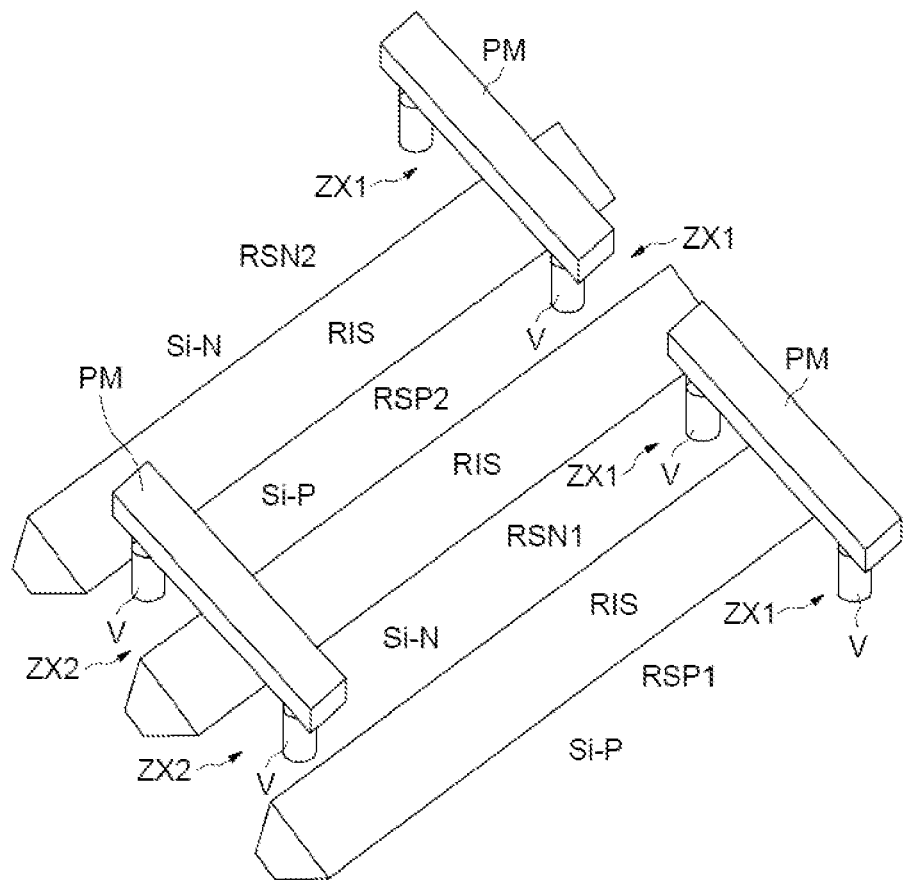

This is illustrated more particularly in FIG. 4, which shows the connection means of the generator shown in FIG. 3.

Thus, the end zone ZX1 of the semiconductor region RSN1 is electrically connected to the similar end zone ZX1 of the region RSP1 by a metal track PM straddling the isolating region RIS separating these two regions RSN1 and RSP1. This metal track is connected to the end zones ZX1 by vias V.

Similarly, the end zones ZX2 of the regions RSN1 and RSP2 are also connected together by a metal track PM straddling the region RIS separating these two regions RSN1 and RSP2. This metal track PM is connected to the end zones ZX2 by vias V.

Similarly, the two end zones ZX1 of the regions RSP2 and RSN2 are connected in the same way by a metal track PM straddling the isolating region RIS. This metal track is connected to the zones ZX1 by the intermediary of vias V.

Figure 5:
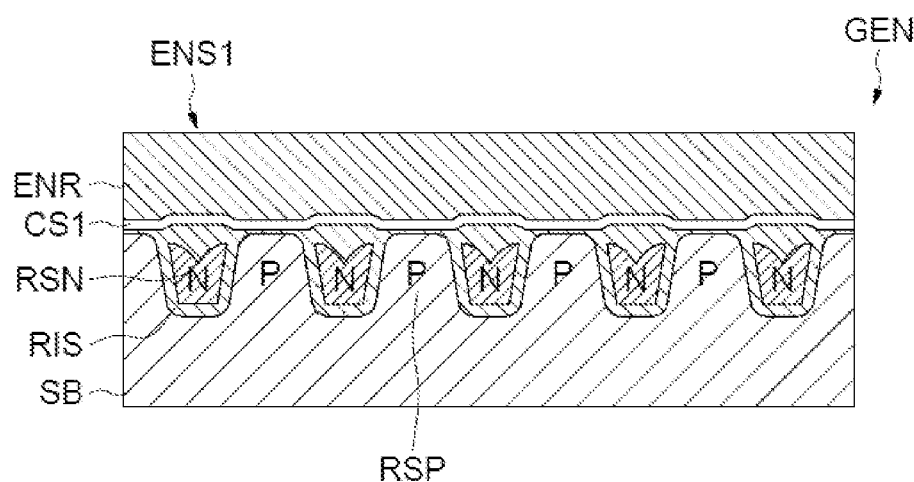

The embodiment shown in FIG. 5 differs from that of FIG. 3 and of FIG. 4 in that the set ENS1 of thermocouples comprises, on the one hand, first parallel semiconductor regions RSP all extending in the substrate SB and all having one of the two types of conductivity, in this case P-type conductivity. Two adjacent first semiconductor regions RSP are separated by an isolating region RIS.

On the other hand, the set of thermocouples comprises second parallel semiconductor regions RSN all extending respectively within isolating regions RIS and all having the other type of conductivity, in this case N-type conductivity.

It is appropriate to note here that this embodiment has the advantage of providing a generator having a greater number of pairs PN, for the same overall surface dimensions as those of FIG. 3, which makes it possible to increase the delivered electrical power.

The method of manufacturing the generator is slightly modified in comparison with a conventional manufacturing method of the embedded memory type. More precisely, after formation of the trenches in the silicon and formation on the walls of the trenches of an oxide layer cladding the latter, the doped polysilicon is deposited in situ. The silicon overflowing the trenches is subsequently etched in a conventional way, for example, by dry etching.

Figure 6:
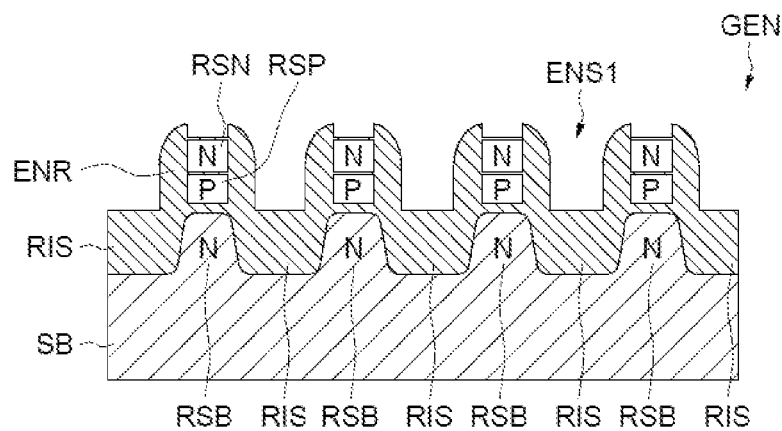
Figure 7:
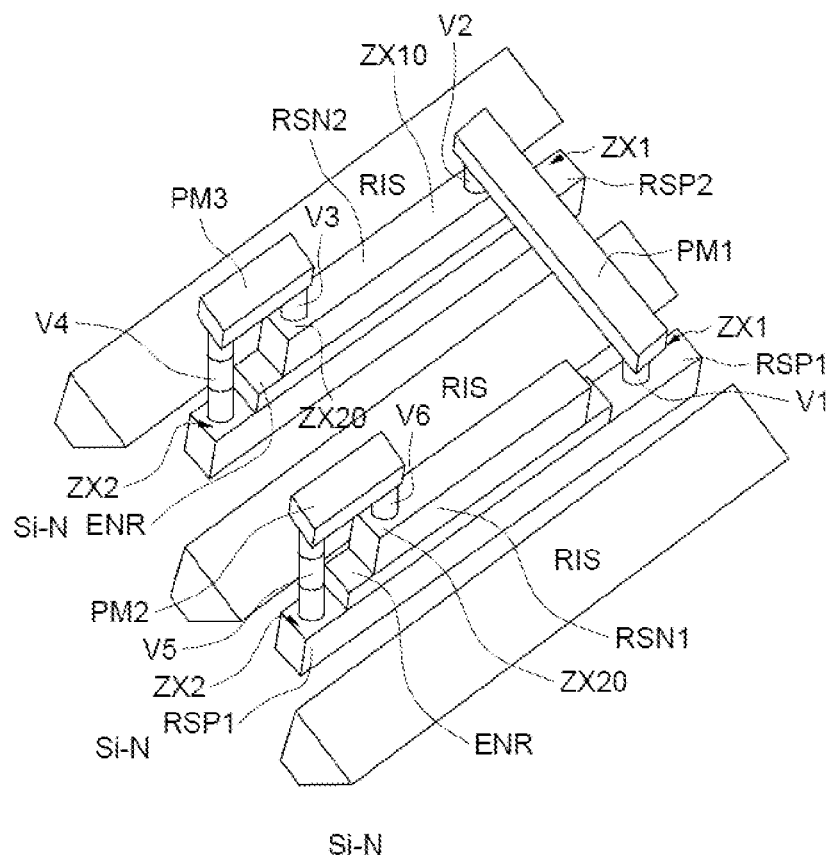

In the embodiment shown in FIGS. 6 and 7, the substrate upon which the generator GEN is formed comprises, between the parallel isolating regions RIS, regions of substrate RSB all having the same type of conductivity, namely in this case for example N-type conductivity.

Moreover, the set ENS1 of thermocouples here comprises, above each region of substrate RSB, at least one pair of semiconductor regions RSP, RSN, coated with an isolating material ENR and respectively having the two types of conductivity.

More precisely, in this example, the lower semiconductor regions RSP of the pairs have P-type conductivity and are surmounted by the regions RSN which have N-type conductivity.

The isolating coating comprises, in a conventional way, silicon nitride and silicon dioxide and corresponds to the conventional coating of non-volatile memories having two gates, (one of which is floating). In this respect, the method of manufacturing the thermocouple of the generator GEN in FIG. 6 is similar to the method of manufacturing a memory plane with floating gates.

Here again, as shown in FIG. 7, metal tracks and vias make it possible to electrically connect the thermocouples in series. More precisely, a first end zone ZX1 of a first semiconductor region RSP1 is connected to the first similar end zone ZX10 of the semiconductor region RSN2 of the adjacent pair by vias V1 and V2 and a portion of metal track PM1.

Moreover, the second end zones ZX20 of the regions RSN1 and RSN2 are connected to the second similar end zones ZX2 of the regions RSP1 and RSP2 by vias V3, V4, V5, V6 and portions of metal tracks PM2, PM3.

It is appropriate to note here that, just as in the embodiment shown in FIG. 3, the portion PM1 straddles the isolating region RIS separating the two pairs of semiconductor regions RSP1, RSN1 and RSP2, RSN2.

It would also be possible, as a variant, for the pairs of semiconductor regions to be situated not above the regions of substrate but above the isolating regions RIS.

Figure 8:
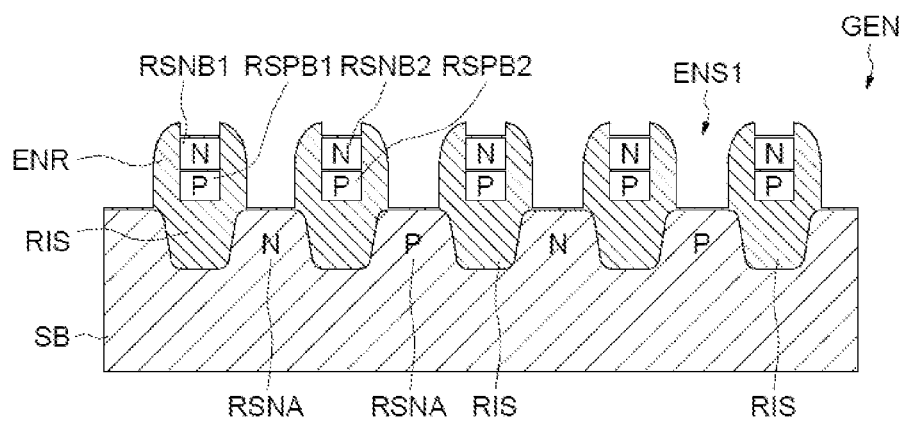

This is the case in the embodiment shown in FIG. 8. In this embodiment, the set ENS1 of thermocouples of the generator GEN comprises parallel semiconductor regions RSNA, RSPA extending in the substrate and having, respectively and alternatingly, one and the other of the two types of conductivity (N and P) and being separated by parallel isolating regions RIS.

Furthermore, as mentioned above, in addition to these regions of substrate RSNA, RSPA, the set ENS1 comprises, above each isolating region, a pair of semiconductor regions RSPBi and RSNBi coated with an isolating material ENR and respectively having the two types of conductivity N and P.

Thus, in comparison with the embodiment shown in FIG. 6, and for the same overall surface dimensions, the generator GEN shown in FIG. 8 has a greater number of pairs PN than the number of pairs PN of the generator shown in FIG. 6.

Here again, the generator shown in FIG. 8 is perfectly compatible with the methods of manufacturing embedded non-volatile memory.

Figure 9:
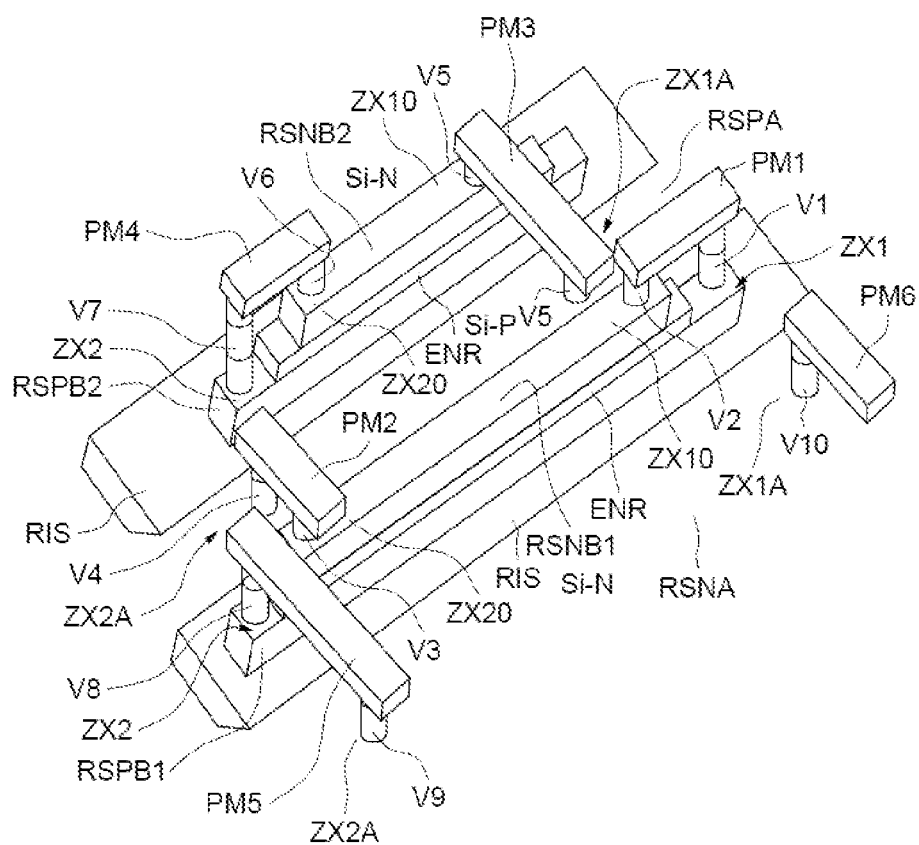

The means of electrical connection between the various components of the various thermocouples are shown diagrammatically in FIG. 9.

More precisely, a first end zone ZX1 of the semiconductor region RSPB1 situated above the isolating region RIS is connected to the first similar end zone ZX10 of the region RSNB1 by vias V1 and V2 and a portion of the metal track PM1.

The second end zone ZX20 of the region RNSB1 is connected to the second end zone ZX2A of the region of substrate RSPA by vias V3 and V4 and by a portion of metal track PM2.

The electrical continuity between the region RSPA and the region RSNB2 is provided by vias V5 and a portion of metal track PM3, connecting the first two similar end zones ZX1A and ZX10 of the region RSPA and the region RSNB2.

The electrical continuity between the regions RSNB2 and RSPB2 is provided by vias V6 and V7 and a portion of metal track PM4 connection the two similar ends ZX20 and ZX2 of these two regions.

The electrical continuity between the region RSPB1 and the adjacent region of substrate RSNA is provided, at the level of their respective second end zones ZX2 and ZX2A, by vias V8 and V9 and a portion of metal track PM5.

Similarly, the electrical continuity between this region RSNA and the semiconductor region RSPB of the adjacent pair is provided by a via V10 and a portion of metal track PM6 at the level of the end zone ZX1A of the region RSNA.

Figure 10:
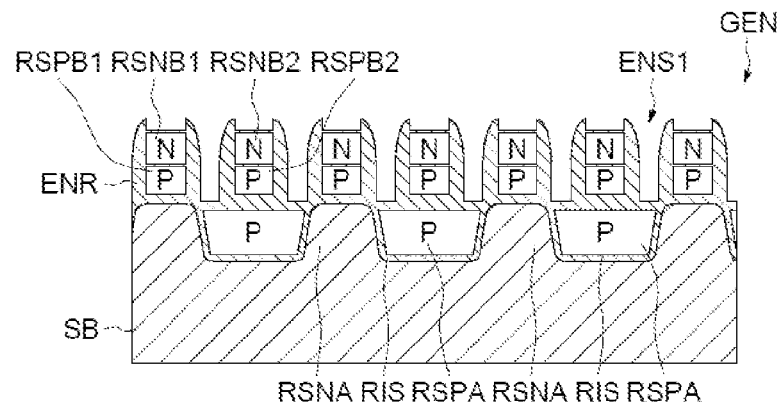

The embodiment of the generator GEN shown in FIG. 10 differs from the one shown in FIG. 8 in that the set ENS1 of thermocouples furthermore comprises parallel semiconductor regions extending within the isolating regions RIS.

More precisely, the set ENS1 of thermocouples comprises parallel regions of substrate RSNA all having the same type of conductivity, in this case N-type conductivity, semiconductor regions RSPA extending within the isolating regions RIS separating these regions of substrate RSNA and all having the other type of conductivity, namely, P-type conductivity, and, above each region of substrate RSNA, pairs of parallel semiconductor regions RSPBi and RSNBi coated with an isolating material ENR.

Thus, such an embodiment, perfectly compatible with the technology of embedded non-volatile memories, comprises, in comparison with the embodiment shown in FIG. 3, a greater number of pairs PN for the same surface imprint, which makes it much more efficient in terms of produced electrical energy.

Figure 11:
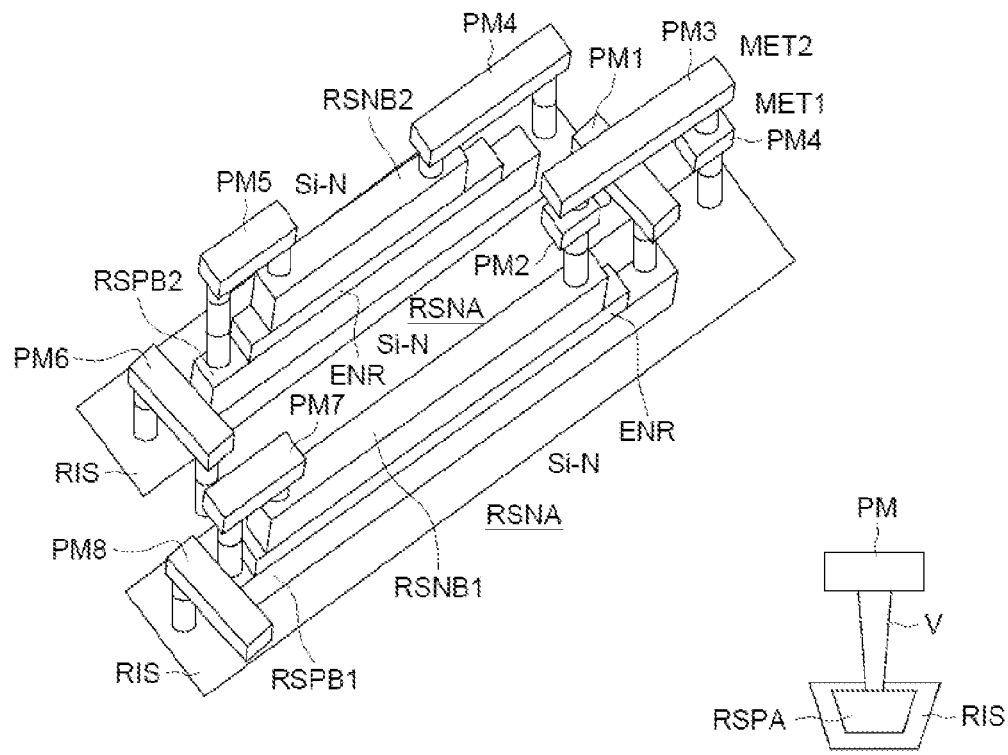

The electrical connections between the various parts of the various thermocouples of the generator shown in FIG. 10 are shown diagrammatically in FIG. 11. This time, some of these connections extend over both of two metallization layers of the integrated circuit, namely the metal level 1 MET1 and the metal level 2 MET2.

Just as in the preceding embodiments, the electrical continuity between the various components of the various thermocouples connected in series is carried out by vias and portions of metal track connecting two end zones of two semiconductor regions having the two opposite types N and P.

Moreover, whilst the electrical connection between the region RSPB1 and the region RSNA is carried out by a portion of metal track PM1 situated at the metal level MET1, the electrical connection between the region RSNB1 and the region RSPA encapsulated in the isolation region RIS is carried out in particular by three portions of metal track PM2, PM3, PM4 situated at the metallization levels MET1 et MET2.

The lower right hand side of FIG. 11 shows the connection between a portion of metal track PM and a semiconductor region RSPA encapsulated in a region RIS by the intermediary of a via V traversing the region RIS in order to contact the region RSPA.

The other electrical continuities of the regions shown in FIG. 11 comprise in particular portions of metal track PM4, PM5, PM6, PM7, PM8.

Figure 12:
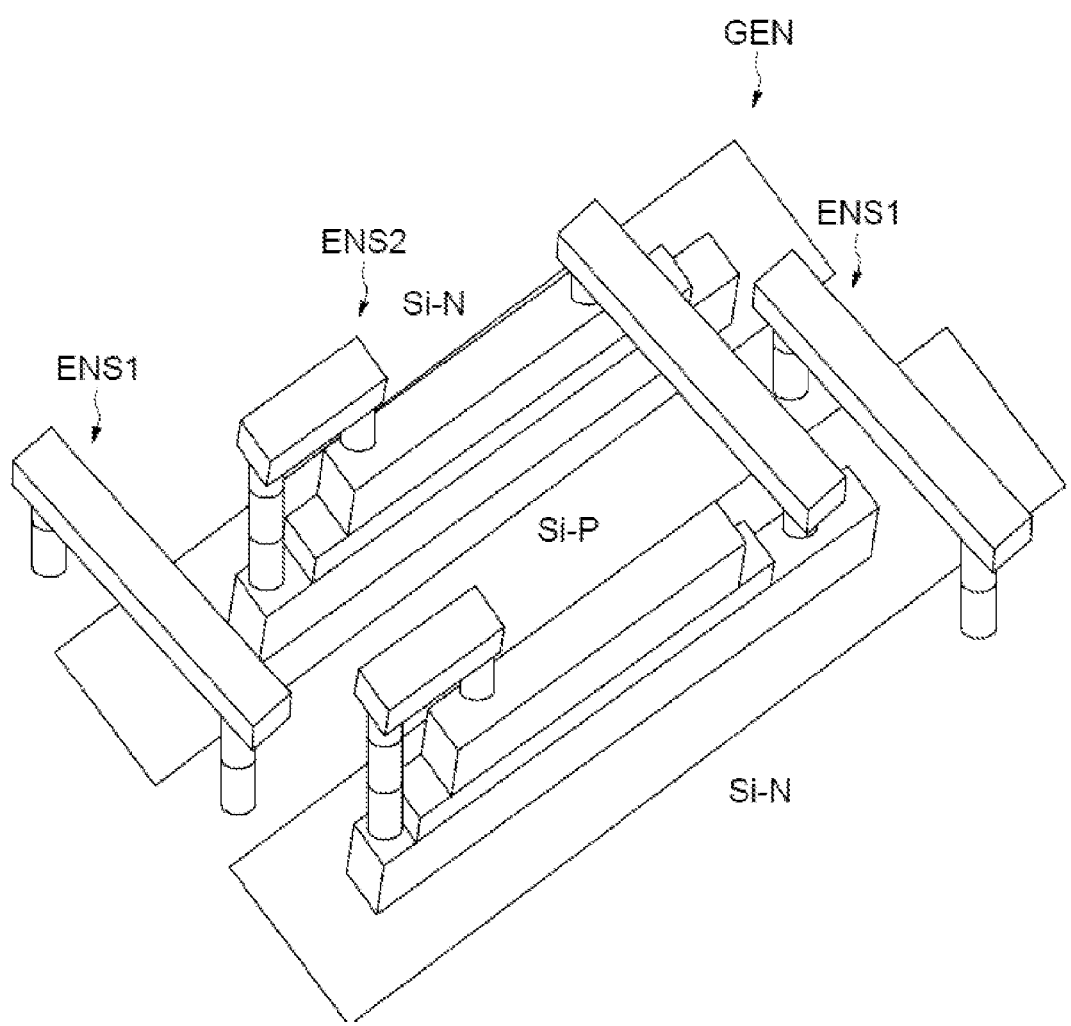

As mentioned above with reference to FIG. 2, it is possible to electrically connect two sets of thermocouples in parallel. An example of such an embodiment is shown in FIG. 12.

In this figure, the generator GEN comprises for example the set of thermocouples ENS1 shown in FIGS. 3 and 4, and the set of thermocouples ENS2 shown in FIGS. 6 and 7.

Silicon is a very good conductor of heat, such that the two temperature levels present at the two ends of the thermocouples respectively and initially different can rapidly become equal, which then stops the generation of electrical power.

Figure 13:
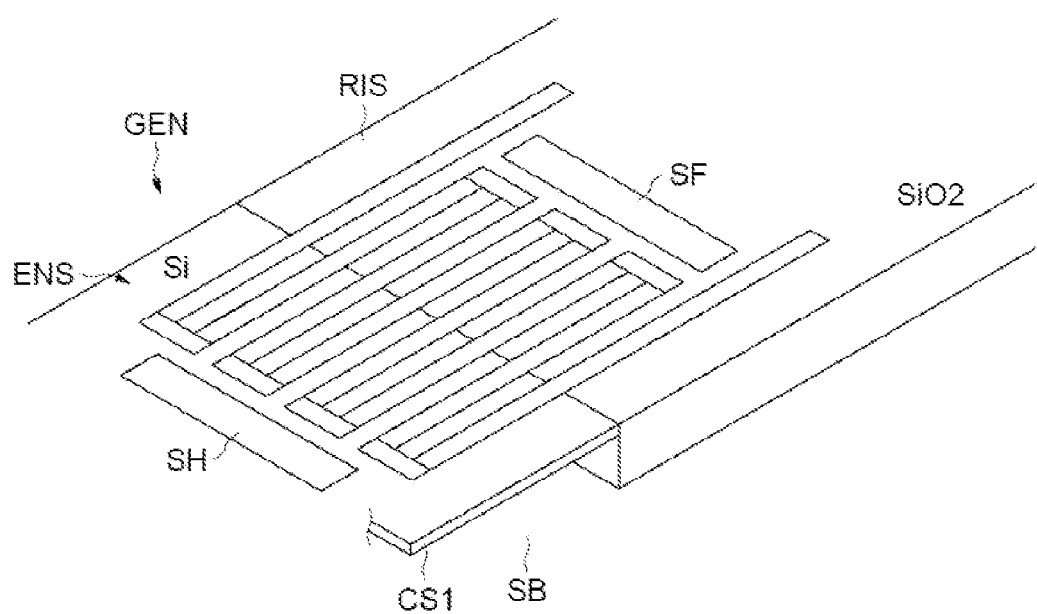

Whereas, in the prior art, solutions have been proposed not using silicon or using technologies of the MEMS type in such a way as to create cavities, the embodiment shown in FIG. 13 makes it possible, in general, in particular by the use of polysilicon, to delay the equalizing of the temperatures whilst remaining compatible with conventional CMOS manufacturing technologies.

More precisely, as shown very diagrammatically in FIG. 13, a part of the set of thermocouples ENS of the generator GEN extends over a part of the substrate SB covered with an isolating layer CS1, for example a thin layer of silicon dioxide, whilst the other part of the set of thermocouples extends over an isolating region RIS, thicker than the isolating layer covering the silicon substrate, this layer RIS being able to be a shallow isolating trench of the STI type.

Because of this, considering that the isolating material, generally silicon dioxide, is a very poor conductor of heat, the equalizing of the temperatures between the two ends of the thermocouples is delayed, which improves the efficiency of the generator.

Figure 14:
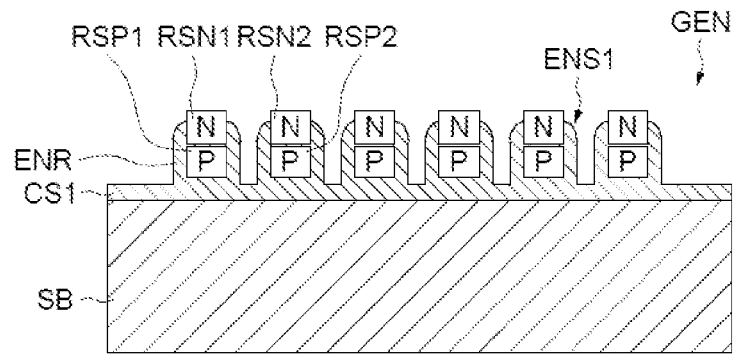
Figure 15:
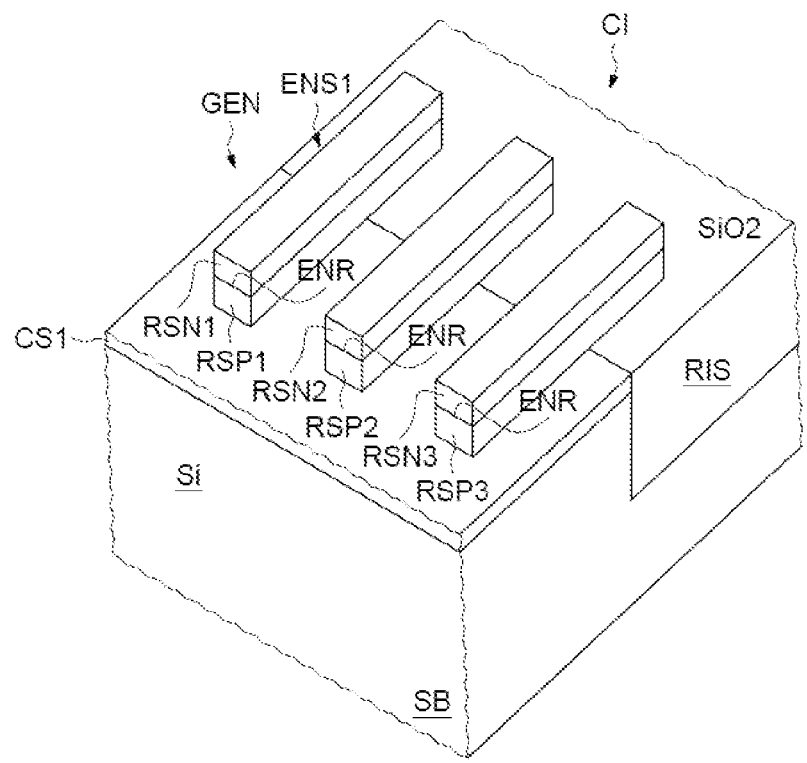

A more precise example of embodiment is shown in FIGS. 14 and 15.

In FIG. 14, the substrate SB is covered by a thin isolating layer CS1 of silicon dioxide.

The set ENS1 of thermocouples comprises several parallel pairs of parallel semiconductor regions RSNi, RSPi respectively having the two types of conductivity N and P, these pairs straddling over the isolating layer CS1 and over the isolating region RIS, thicker than the isolating region CS1.

Figure 16:
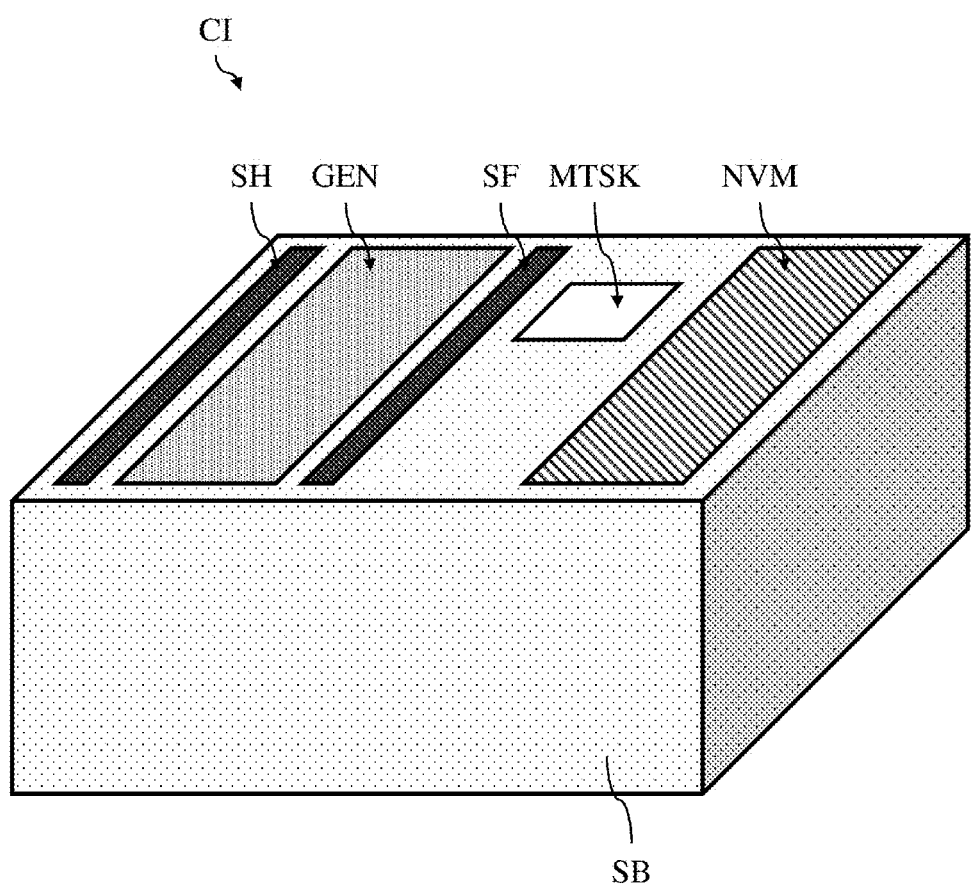
FIG. 16 is a diagrammatic illustration of still another example of a generator according to the invention.

In FIG. 16, an integrated circuit CI includes a semiconductor substrate SB, a thermoelectric generator GEN, a hot source SH, a cold source SF, an electrical energy storage structure MSTK, and an array of non-volatile memory cells NVM. Description included hereinabove in reference to commonly identified elements applies to FIG. 16 and will not be repeated in the interests of brevity. Any of the embodiments described hereinabove may be applied to elements of FIG. 16. In various embodiments, hot source SH and cold source SF generate a temperature gradient along a region of the semiconductor substrate SB. Thermoelectric generator GEN generates electrical power located in the region of the semiconductor substrate SB. Thermoelectric generator GEN includes at least one set of thermocouples integrated at a surface of the semiconductor substrate SB. Electrical energy storage structure MSTK is disposed in the semiconductor substrate SB and stores the generated electrical power. The array of non-volatile memory cells NVM is disposed in the semiconductor substrate SB.

What is claimed is:
1. An integrated thermoelectric generator, comprising:
a support comprising a semiconductor substrate and isolating regions; and
a set of thermocouples extending along a surface of the semiconductor substrate between a first zone and a second zone in the semiconductor substrate, the set of thermocouples thermally connected in parallel between the first zone and the second zone, wherein each thermocouple of the set of thermocouples comprises semiconductor regions extending along parallel lines between the first zone and the second zone, each semiconductor region having one type of conductivity from among two opposite types of conductivity, wherein the semiconductor regions of the set of thermocouples are electrically connected in series so as to form a chain of semiconductor regions having, alternatingly, one and the other of the two types of conductivity.

2. The generator according to claim 1, wherein the semiconductor regions extend in the substrate between isolating regions.

3. The generator according to claim 1, wherein the semiconductor regions straddle over a part of the substrate and are electrically isolated from the part of substrate and over at least a part of the isolating regions.

4. The generator according to claim 1, wherein the semiconductor regions are coated with an isolating material and extend totally over isolating regions.

5. The generator according to claim 1, wherein the semiconductor regions are coated with an isolating material and extend totally over regions of substrate situated between isolating regions.

6. The generator according to claim 1, wherein the semiconductor regions are regions of N-doped or P-doped polysilicon.

7. The generator according to claim 1, further comprising electrically conductive connections that provide an electrical link between the semiconductor regions.

8. The generator according to claim 7, wherein the connections are situated above the substrate and connect an end zone of a semiconductor region having one of the two types of conductivity to an end zone of a semiconductor region having the other type of conductivity.

9. The generator according to claim 7, wherein the connections are coated with an isolating material and comprise metal tracks that extend parallel to the semiconductor regions and are connected to end zones of the semiconductor regions by vertical electrical links.

10. The generator according to claim 1, wherein the support comprises parallel isolating regions, the set of thermocouples being situated in the substrate and comprising semiconductor regions extending along parallel lines and extending in the substrate, wherein two adjacent semiconductor regions have one and the other of the two types of conductivity, respectively, and are separated by an isolating region.

11. The generator according to claim 1, wherein the support comprises parallel isolating regions, the set of thermocouples comprising first semiconductor regions extending along parallel lines and that all extend in the substrate and have one of the two types of conductivity, two adjacent first semiconductor regions being separated by an isolating region, wherein the set of thermocouples also comprises second semiconductor regions extending along parallel lines and that all extend in isolating regions and all having the other type of conductivity.

12. The generator according to claim 1, wherein the support comprises parallel isolating regions and wherein regions of substrate situated between the isolating regions all have the same type of conductivity, the set of thermocouples comprising, above each region of substrate, at least one pair of semiconductor regions coated with an isolating material and having the two types of conductivity, respectively.

13. The generator according to claim 1, wherein the substrate comprises a part covered by an isolating layer, the set of thermocouples comprising several parallel pairs of semiconductor regions extending along parallel lines and covered by an isolating material, each pair having the two types of conductivity, respectively, the pairs straddling over the isolating layer and an isolating region thicker than the isolating layer.

14. The generator according to claim 1, wherein the support comprises parallel isolating regions and wherein the set of thermocouples comprises, above each isolating region, at least one pair of semiconductor regions coated with an isolating material and having the two types of conductivity, respectively.

15. The generator according to claim 1, wherein the support comprises parallel isolating regions and wherein the set of thermocouples comprises semiconductor regions extending along parallel lines and extending in the substrate, two adjacent semiconductor regions respectively having one and the other of the two types of conductivity and being separated by an isolating region, wherein at least one pair of semiconductor regions coated with an isolating material and respectively having the two types of conductivity is disposed above each isolating region.

16. The generator according to claim 1, wherein the support comprises parallel isolating regions wherein the set of thermocouples comprises first semiconductor regions extending along parallel lines and extending between the isolating regions and all have one of the two types of conductivity, second semiconductor regions extending along parallel lines and that extend within the isolating regions and all have the other type of conductivity, and, above each first region, at least one pair of semiconductor regions coated with an isolating material and respectively having the two types of conductivity.

17. The generator according to claim 1, further comprising a second set of thermocouples electrically connected in series and thermally connected in parallel.

18. The generator according to claim 17, wherein the set of thermocouples and the second set of thermocouples are mutually electrically and thermally connected in parallel.

19. The generator according to claim 18, wherein:
the support comprises parallel isolating regions;
the set of thermocouples is situated in the substrate and comprises semiconductor regions extending along parallel lines and extending in the substrate, wherein two adjacent semiconductor regions have one and the other of the two types of conductivity, respectively; and
the second set of thermocouples comprises, above each isolating region, at least one pair of semiconductor regions coated with an isolating material and having the two types of conductivity, respectively.

20. An integrated thermoelectric generator, comprising a support and at least one set of thermocouples extending along a surface of a semiconductor substrate between a first zone and a second zone in the semiconductor substrate, the at least one set of thermocouples electrically connected in series and thermally connected in parallel between the first zone and the second zone, wherein the support comprises the semiconductor substrate and isolating regions, and wherein the at least one set of thermocouples comprises semiconductor regions extending along parallel lines between the first zone and the second zone with each semiconductor region having one type of conductivity from among two opposite types of conductivity, at least some of the semiconductor regions extending in the substrate between parallel isolating regions, or at least some of the semiconductor regions straddling over a part of the substrate whilst being electrically isolated from the part of substrate and over at least a part of the isolating regions, or at least some the semiconductor regions being coated with an isolating material and extending totally over parallel isolating regions or totally over the regions of substrate situated between the parallel isolating regions, the semiconductor regions of the at least one set of thermocouples being electrically connected in series so as to form a chain of semiconductor regions having, alternatingly, one and the other of the two types of conductivity.

21. An integrated circuit, comprising:
a semiconductor substrate;
levels of metallization above the substrate;
a generator disposed in the substrate, the generator comprising a set of thermocouples electrically connected in series and thermally connected in parallel, the set of thermocouples comprising semiconductor regions, each semiconductor region having one type of conductivity from among two opposite types of conductivity, wherein the semiconductor regions are electrically connected in series so as to form a chain of regions having, alternatingly, one and the other of the two types of conductivity, electrical connections between the thermocouples comprising metal tracks extending over at least one level of metallization;
a temperature gradient generator between first end zones and second end zones of the semiconductor regions of the thermocouples; and
an electrically conductive output structure coupled to the generator in order to deliver electrical energy produced by the generator.

22. The integrated circuit according to claim 21, further comprising an electrical energy storage unit electrically coupled to the electrically conductive output structure.

23. The integrated circuit according to claim 22, wherein the electrical energy storage unit comprises a capacitor.

24. An integrated circuit, comprising:
a semiconductor substrate;
a plurality of non-volatile memory cells disposed in the semiconductor substrate; and
a set of thermocouples disposed in the semiconductor substrate, the set of thermocouples comprising semiconductor regions electrically connected in series and thermally connected in parallel, wherein the semiconductor regions are electrically connected in series so as to form a chain of regions having, alternatingly, n-type and p-type semiconductors.

25. The integrated circuit according to claim 24, further comprising a temperature gradient generator adjacent to the set of thermocouples.

26. The integrated circuit according to claim 25, further comprising a capacitor configured to store energy generated by the set of thermocouples.

27. An integrated circuit, comprising:
a semiconductor substrate;
means for generating a temperature gradient along a region of the semiconductor substrate;
means for generating electrical power located in the region of the semiconductor substrate, the means for generating electrical power comprising at least one set of thermocouples integrated at a surface of the semiconductor substrate;
means for storing the generated electrical power disposed in the semiconductor substrate; and
an array of non-volatile memory cells disposed in the semiconductor substrate.

28. The generator according to claim 1, further comprising a temperature gradient generator, wherein the first zone is arranged near a hot source of the temperature gradient generator and the second zone is arranged near a cold source of the temperature gradient generator.

\* \* \* \* \*